United States Patent
Tsai

(10) Patent No.: US 9,795,058 B2
(45) Date of Patent: Oct. 17, 2017

(54) ELECTRONIC DEVICE AND LIQUID COOLING HEAT DISSIPATION DEVICE THEREOF

(71) Applicant: COOLER MASTER CO., LTD., New Taipei (TW)

(72) Inventor: Shui-Fa Tsai, New Taipei (TW)

(73) Assignee: COOLER MASTER CO., LTD., New Taipei (TW)

( * ) Notice: Subject to any disclaimer, the term of this patent is extended or adjusted under 35 U.S.C. 154(b) by 87 days.

(21) Appl. No.: 14/867,860

(22) Filed: Sep. 28, 2015

(65) Prior Publication Data

US 2016/0363967 A1    Dec. 15, 2016

(30) Foreign Application Priority Data

Jun. 11, 2015 (CN) .......................... 2015 2 0400920

(51) Int. Cl.
   *H05K 7/20* (2006.01)
   *G06F 1/20* (2006.01)

(52) U.S. Cl.
   CPC ........... *H05K 7/20272* (2013.01); *G06F 1/20* (2013.01); *H05K 7/20254* (2013.01)

(58) Field of Classification Search
   CPC ........... H05K 7/20218; H05K 7/20254; H05K 7/2039; H05K 7/20409; H01L 23/34; H01L 23/3672; H01L 23/3677; H01L 23/473; H01L 23/427; F28F 3/12; F28F 3/048; F28D 15/00; G06F 1/20
   USPC .............. 361/699, 701–703, 679.47, 679.53; 165/80.4–80.5, 104.33, 104.19, 104.28, 165/104.31; 257/714
   See application file for complete search history.

(56) References Cited

U.S. PATENT DOCUMENTS

| | | | | |
|---|---|---|---|---|
| 6,600,649 B1 * | 7/2003 | Tsai | ...................... | H01L 23/473 165/104.33 |
| 6,832,646 B1 * | 12/2004 | Uomori | ................... | G06F 1/203 165/80.2 |
| 7,274,566 B2 * | 9/2007 | Campbell | ............ | H05K 7/2079 165/80.4 |
| 7,753,662 B2 * | 7/2010 | Lai | ...................... | F04D 13/0606 165/80.4 |
| 7,762,314 B2 * | 7/2010 | Campbell | ................. | F28F 3/02 165/80.3 |

(Continued)

*Primary Examiner* — Zachary M Pape
*Assistant Examiner* — Amir Jalali
(74) *Attorney, Agent, or Firm* — Muncy, Geissler, Olds & Lowe, P.C.

(57) ABSTRACT

A liquid cooling heat dissipation device includes a heat-dissipating module and a liquid supply module. The liquid supply module includes an outer cover body disposed on the heat-dissipating module and at least one pump disposed inside the outer cover body. The outer cover body has an inner space divided into a first independent space adjacent to the heat-dissipating module and a second independent space far away from the heat-dissipating module and insulated from the first independent space, the at least one pump includes a stator disposed inside the first independent space and a rotator disposed inside the second independent space, and the stator is closer to the heat-dissipating module than the rotator. The instant disclosure further provides an electronic device using the liquid cooling heat dissipation device.

18 Claims, 14 Drawing Sheets

(56) References Cited

U.S. PATENT DOCUMENTS

| | | | | |
|---|---|---|---|---|
| 7,905,712 B2 * | 3/2011 | Huang | F04D 29/586 | 310/216.023 |
| 8,051,898 B2 * | 11/2011 | Chiang | H01L 23/473 | 165/104.28 |
| 8,382,456 B2 * | 2/2013 | Scott | F04D 15/0083 | 361/679.53 |
| 9,057,567 B2 * | 6/2015 | Lyon | F28D 15/00 | |
| 9,170,056 B2 * | 10/2015 | Holahan | F04D 13/024 | |
| 9,463,536 B2 * | 10/2016 | Rice | B23P 15/26 | |
| 2005/0056404 A1 * | 3/2005 | Lee | H01L 23/3672 | 165/104.33 |
| 2005/0069432 A1 * | 3/2005 | Tomioka | F04D 29/588 | 417/423.1 |
| 2005/0082040 A1 * | 4/2005 | Lee | F28F 3/12 | 165/104.33 |
| 2005/0183848 A1 * | 8/2005 | Cheng | F28F 3/12 | 165/104.33 |
| 2006/0021737 A1 * | 2/2006 | Lee | F28D 15/00 | 165/80.4 |
| 2006/0171801 A1 * | 8/2006 | Manabe | F04D 13/0673 | 415/176 |
| 2006/0185829 A1 * | 8/2006 | Duan | H01L 23/473 | 165/104.33 |
| 2006/0185830 A1 * | 8/2006 | Duan | H01L 23/473 | 165/104.33 |
| 2008/0104992 A1 * | 5/2008 | Lai | H01L 23/473 | 62/435 |
| 2008/0289803 A1 * | 11/2008 | Yang | F04D 13/0606 | 165/104.31 |
| 2008/0295534 A1 * | 12/2008 | Farrow | F04C 18/086 | 62/259.2 |
| 2009/0044929 A1 * | 2/2009 | Yeh | F28D 1/05391 | 165/104.19 |
| 2009/0159244 A1 * | 6/2009 | Mounioloux | F04D 29/586 | 165/104.33 |
| 2011/0100612 A1 * | 5/2011 | Tang | G06F 1/20 | 165/104.33 |
| 2016/0338223 A1 * | 11/2016 | Tsai | F28F 1/00 | |

* cited by examiner

ELECTRONIC DEVICE AND LIQUID COOLING HEAT DISSIPATION DEVICE THEREOF

BACKGROUND OF THE INVENTION

1. Field of the Invention

The instant disclosure relates to an electronic device and a heat dissipation structure thereof, and more particularly to an electronic device and a liquid cooling heat dissipation device thereof.

2. Description of Related Art

Over the years, the processing velocity of CPUs has become faster, thus generating larger amounts of heat. In order to dissipate the heat from the heat source to the external world, a heat-dissipating device and a fan are usually used to help dissipate the heat. However, the fan is noisy and consumes lots of power due to its high rotational speed. It has so far proven difficult for designers to solve these problems of noise and power consumption.

In order to solve the above-mentioned question, the prior art provides a water block heat-dissipating structure including a seat body and a seal cover body. The seat body has a plurality of heat-dissipating fins formed thereon, and a bottom portion of the seat body contacting a heat-generating source. In addition, the seal cover body is used to seal and cover the seat body. The seal cover body further has a water inlet and a water outlet. When the bottom portion of the seat body contacts a heat-generating source, heat is transmitted from the heat-generating source to the heat-dissipating fins. In addition, the heat of the first heat-dissipating fins can be guided away quickly by cooling liquids that circulate between the water inlet and the water outlet.

SUMMARY OF THE INVENTION

One aspect of the instant disclosure relates to an electronic device and a liquid cooling heat dissipation device thereof.

One of the embodiments of the instant disclosure provides a liquid cooling heat dissipation device, comprising: a heat-dissipating module and a liquid supply module. The liquid supply module includes an outer cover body disposed on the heat-dissipating module and at least one pump disposed inside the outer cover body. The outer cover body has an inner space divided into a first independent space adjacent to the heat-dissipating module and a second independent space far away from the heat-dissipating module and insulated from the first independent space, the at least one pump includes a stator disposed inside the first independent space and a rotator disposed inside the second independent space, and the stator is closer to the heat-dissipating module than the rotator.

Another one of the embodiments of the instant disclosure provides an electronic device, comprising at least one heat generation component and a liquid cooling heat dissipation device contacting the at least one heat generation component. The liquid cooling heat dissipation device includes a heat-dissipating module and a liquid supply module. The liquid supply module includes an outer cover body disposed on the heat-dissipating module and at least one pump disposed inside the outer cover body. The outer cover body has an inner space divided into a first independent space adjacent to the heat-dissipating module and a second independent space far away from the heat-dissipating module and insulated from the first independent space, the at least one pump includes a stator disposed inside the first independent space and a rotator disposed inside the second independent space, and the stator is closer to the heat-dissipating module than the rotator.

Therefore, the instant disclosure provides an electronic device and a liquid cooling heat dissipation device thereof, in which the stator is closer to the heat-dissipating module or nearer to the at least one heat generation component than the rotator due to the designs of "the outer cover body having an inner space divided into a first independent space adjacent to the outer casing body and a second independent space far away from the outer casing body and insulated from the first independent space, and the at least one pump including a stator disposed inside the first independent space and a rotator disposed inside the second independent space", "the outer casing body having an inner space divided into a first receiving space and a second receiving space by the fluid-conducting board, and the first receiving space and the second receiving space being insulated from each other", and "the liquid supply module including at least one first connection pipe connected between the first receiving space of the outer casing body and the second independent space of the outer cover body and at least one second connection pipe connected between the second independent space of the outer cover body and the second receiving space of the outer casing body".

To further understand the techniques, means and effects of the instant disclosure applied for achieving the prescribed objectives, the following detailed descriptions and appended drawings are hereby referred to, such that, and through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

Figure 1:
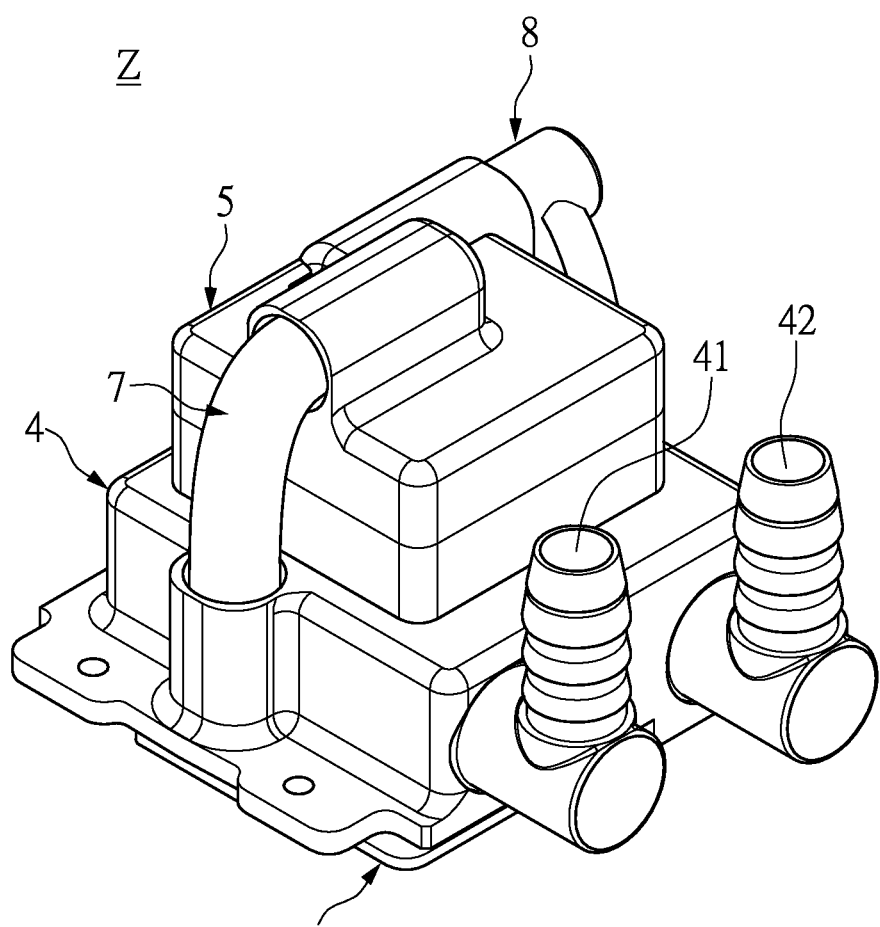
FIG. 1 shows a perspective, assembly, schematic view of the liquid cooling heat dissipation device according to one of the embodiments of the instant disclosure.

The embodiments of "an electronic device and a liquid cooling heat dissipation device thereof" of the instant disclosure are described. Other advantages and objectives of the instant disclosure can be easily understood by one skilled in the art from the disclosure. The instant disclosure can be applied in different embodiments. Various modifications and variations can be made to various details in the description for different applications without departing from the scope of the instant disclosure. The drawings of the instant disclosure are provided only for simple illustrations, but are not drawn to scale and do not reflect the actual relative dimensions. The following embodiments are provided to describe in detail the concept of the instant disclosure, and are not intended to limit the scope thereof in any way.

Referring to FIG. 1 to FIG. 10, one of the embodiments of the instant disclosure provides a liquid cooling heat dissipation device Z, comprising: a heat-dissipating module M1 and a liquid supply module M2, and the heat-dissipating module M1 includes a heat-conducting substrate 1, a fluid-splitting board 2, a fluid-conducting board 3, and an outer casing body 4.

First, referring to FIG. 1 to FIG. 4, the heat-conducting substrate 1 has a heat-conducting body 10 contacting at least one heat generation component H (such as a CPU chip or any heat-generating chip) and a plurality of heat-dissipating fins 11 disposed on the heat-conducting body 10. In addition, the fluid-splitting board 2 is disposed on the heat-dissipating fins 11, the fluid-conducting board 3 is disposed on the fluid-splitting board 2, and the outer casing body 4 is detachably disposed on the heat-conducting body 10 through bolts (screws) S to cover the heat-dissipating fins 11, the fluid-splitting board 12, and the fluid-conducting board 3.

Moreover, referring to FIG. 1 to FIG. 3, and FIG. 7, the liquid supply module M2 includes an outer cover body 5 disposed on the outer casing body 4 of the heat-dissipating module M1 and at least one pump 6 disposed inside the outer cover body 5. More particularly, the outer cover body 5 includes a first cover body portion 5A and a second cover body portion 5B disposed on the first cover body portion 5A.

Please note, referring to FIG. 1, FIG. 2, FIG. 7, and FIG. 10, the outer cover body 5 has an inner space divided into a first independent space 51 adjacent to the outer casing body 4 and a second independent space 52 far away from the outer casing body 4 and insulated or isolated from the first independent space 51. In addition, the at least one pump 6 includes a stator 61 disposed inside the first independent space 51 and a rotator 62 disposed inside the second independent space 52, and the stator 61 is closer or nearer to the outer casing body 4 of the heat-dissipating module M1 than the rotator 62. Moreover, the outer casing body 4 has an inner space divided into a first receiving space R1 and a second receiving space R2 by the fluid-conducting board 3, and the first receiving space R1 and the second receiving space R2 are insulated from each other. Furthermore, the fluid-conducting board 3 has at least one fluid-conducting opening 30 disposed inside the second receiving space R2 and communicated between the second receiving space R2 and a third receiving space R3 for receiving the heat-dissipating fins 11, and the fluid-splitting board 2 has at least one fluid-splitting opening 20 communicated between the second receiving space R2 and the third receiving space R3.

Figure 3:
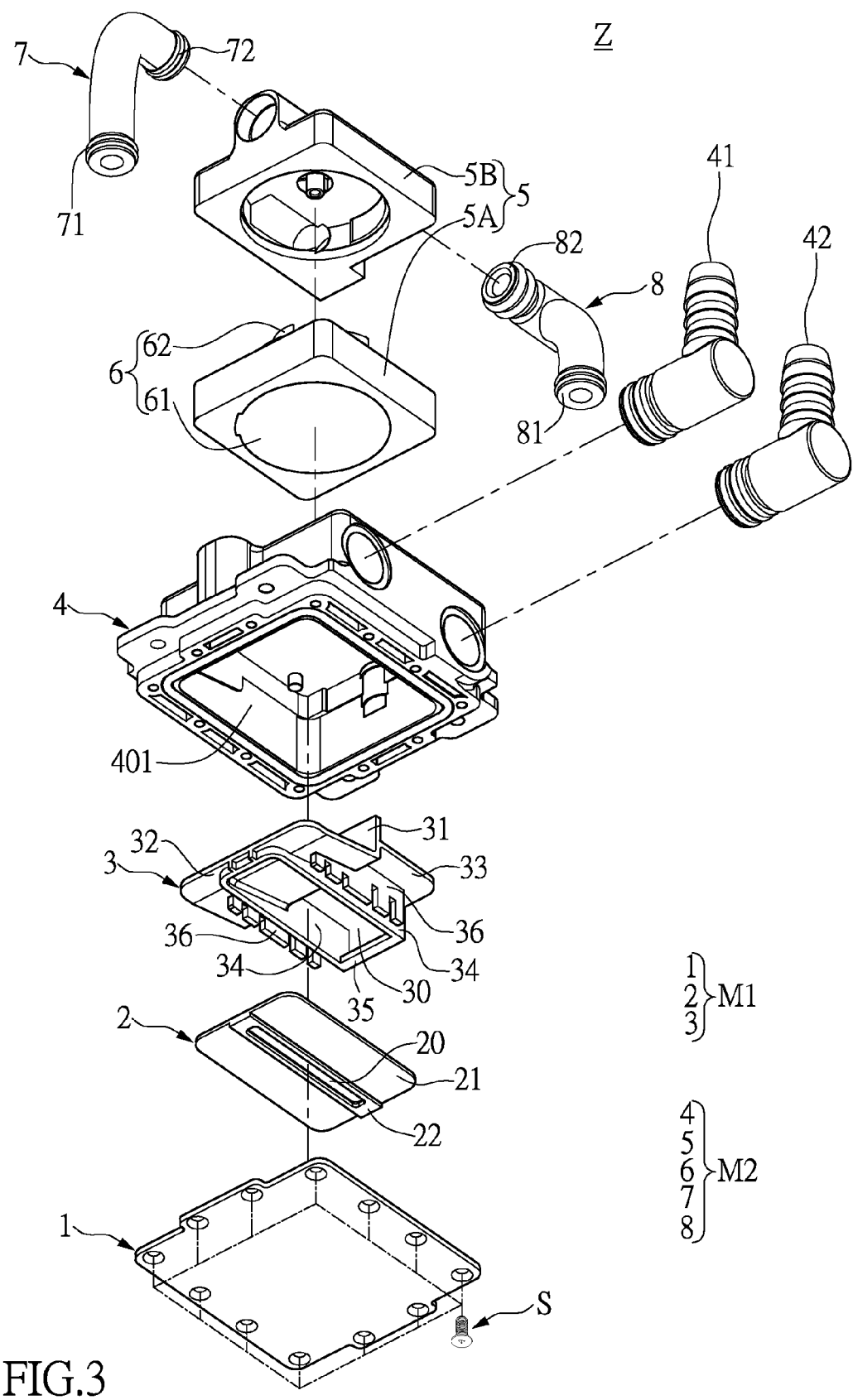
FIG. 3 shows another perspective, exploded, schematic view of the liquid cooling heat dissipation device according to one of the embodiments of the instant disclosure.
Figure 7:
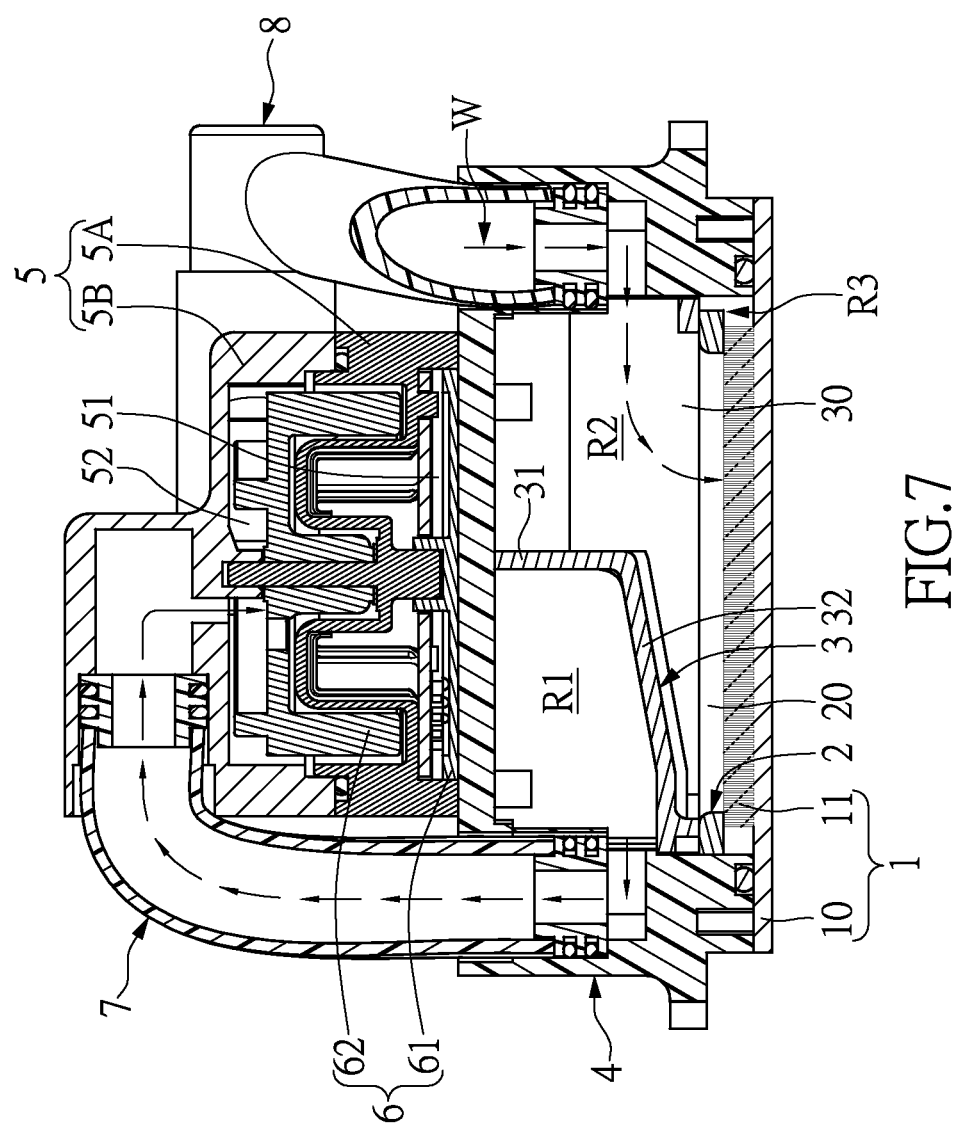
FIG. 7 shows a cross-sectional, schematic view taken along the section line B-B of FIG. 5.
Figure 8:
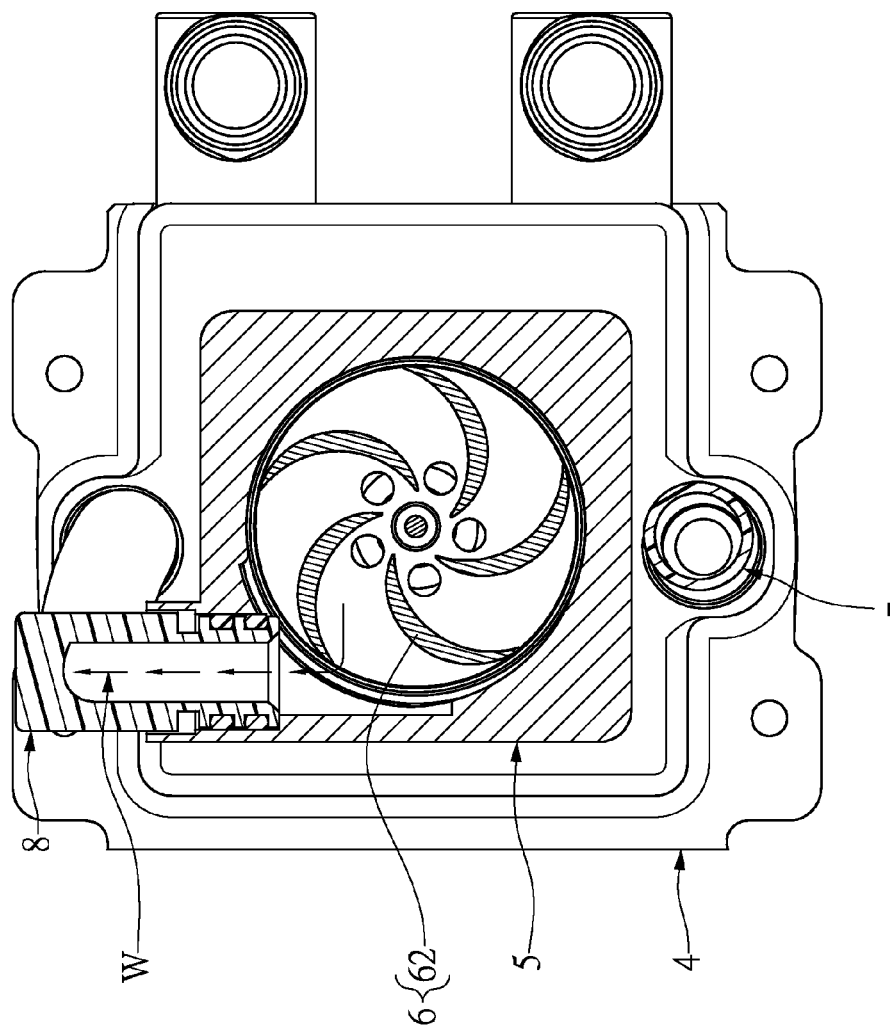
FIG. 8 shows a cross-sectional, schematic view taken along the section line C-C of FIG. 4.
Figure 9:
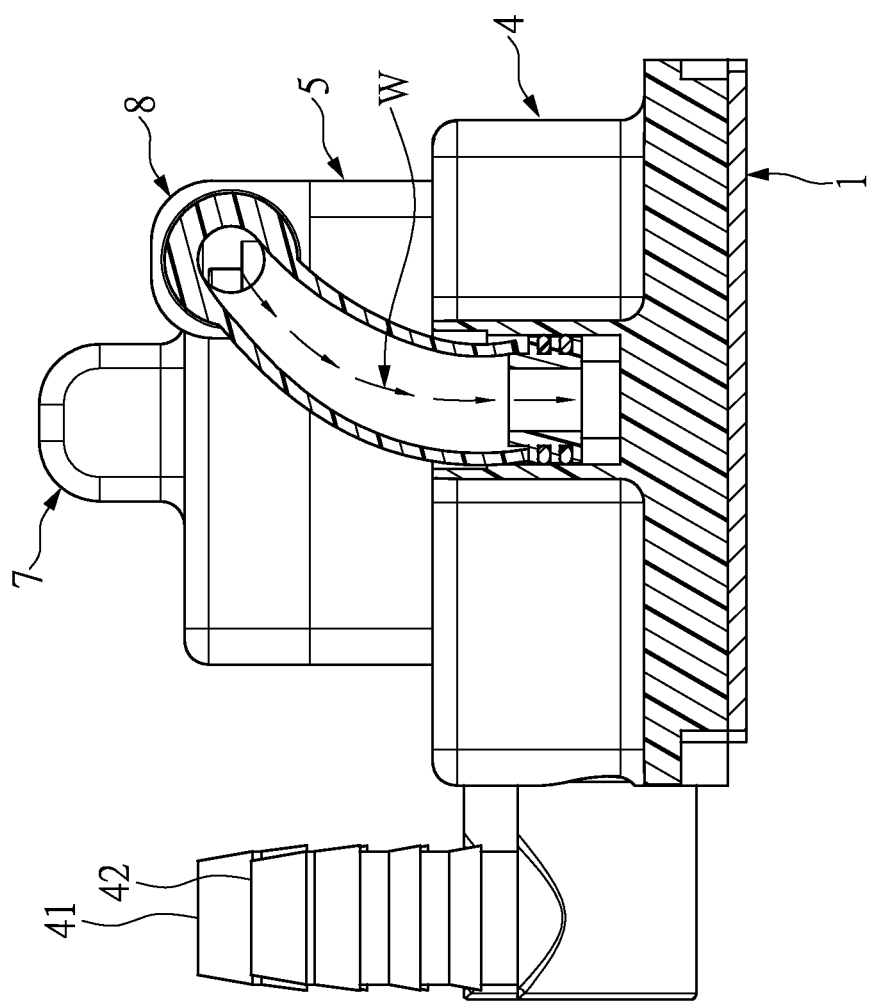
FIG. 9 shows a cross-sectional, schematic view taken along the section line D-D of FIG. 5.

More particularly, referring to FIG. 1, FIG. 3, and FIG. 7, the liquid supply module M2 includes at least one first connection pipe 7 connected between the first receiving space R1 of the outer casing body 4 and the second independent space 52 of the outer cover body 5 and at least one second connection pipe 8 connected between the second independent space 52 of the outer cover body 5 and the second receiving space R2 of the outer casing body 4. In addition, referring to FIG. 6 and FIG. 10, the outer casing body 4 has at least one liquid inlet 41 communicated with (i.e., in fluid communication with) the first receiving space R1 and at least one liquid outlet 42 communicated with the third receiving space R3, and cooling liquid W flows into the outer casing body 4 through the at least one liquid inlet 41 and flows out of the outer casing body 4 through the at least one liquid outlet 42 by driving the rotator 62 of the at least one pump 6.

Figure 2:
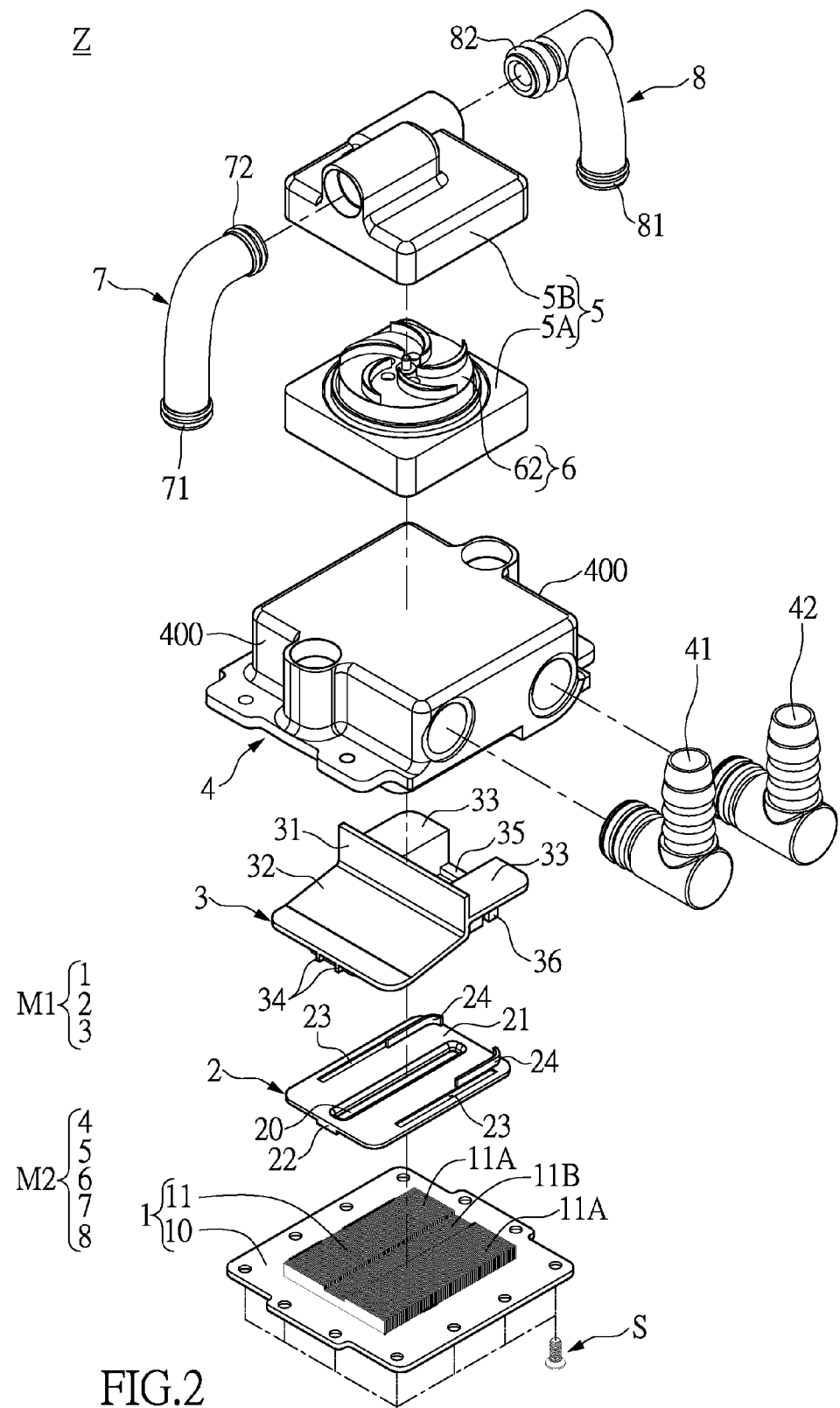
FIG. 2 shows a perspective, exploded, schematic view of the liquid cooling heat dissipation device according to one of the embodiments of the instant disclosure.

More particularly, referring to FIG. 2 and FIG. 3, a first end portion 71 of the first connection pipe 7 and a first end portion 81 of the second connection pipe 8 are respectively connected to two opposite lateral sides 400 of the outer casing body 4, and a second end portion 72 of the first connection pipe 7 and a second end portion 82 of the second connection pipe 8 both are connected to a top side of the outer cover body 5.

Figure 10:
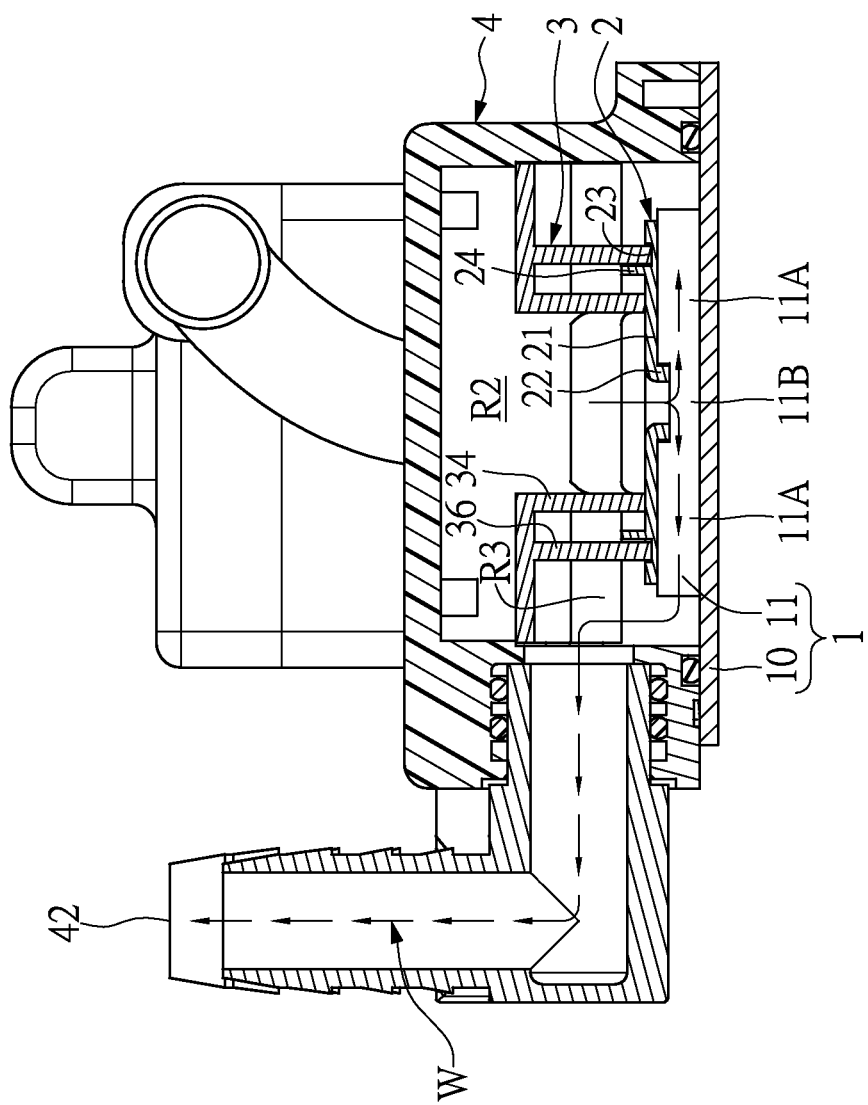
FIG. 10 shows a cross-sectional, schematic view taken along the section line E-E of FIG. 5.

More particularly, referring to FIG. 2, FIG. 3, and FIG. 10, the heat-dissipating fins 11 may be divided into two first heat-dissipating parts 11A corresponding to each other and a second heat-dissipating part 11B connected between the two first heat-dissipating parts 11A, and the fluid-splitting board 2 has a main portion 21 contacting the two first heat-dissipating parts 11A, a convex portion 22 protruded downwardly from a bottom side of the main portion 21 to contact the second heat-dissipating part 11B, a concave portion 23 concaved downwardly from a top side of the main portion 21, and a position-limiting portion 24 protruded upwardly from the top side of the main portion 21.

More particularly, referring to FIG. 2, FIG. 3, and FIG. 7, the position of the fluid-conducting board 3 is limited between an inner surface 401 of the outer casing body 4 and the fluid-splitting board 2. In addition, the fluid-conducting board 3 has a vertical portion 31 upwardly abutted against the inner surface 401 of the outer casing body 4, an inclined portion 32 transversely and obliquely extended from a bottom side of the vertical portion 31 along a first predetermined direction to transversely abut against the inner surface 401 of the outer casing body 4, two extending portions 33 transversely extended from the vertical portion 31 along a second predetermined direction to transversely abut against the inner surface 401 of the outer casing body 4, two first support portions 34 extended downwardly from the vertical portion 31, the inclined portion 32, and the two extending portions 33 to downwardly abut against the main portion 21 of the fluid-splitting board 2 and respectively contact the two position-limiting portions 24, a connection portion 35 connected between the two first support portions 34, and two second support portions 36 extended downwardly from the vertical portion 31, the inclined portion 32, and the two extending portions 33 to be respectively positioned inside two concave portions 23 of the fluid-splitting board 2 and respectively contact the two position-limiting portions 24.

It is worth noting that the cooling liquid W can flow into the outer casing body 4 through the at least one liquid inlet 41 and flow out of the outer casing body 4 through the at least one liquid outlet 42 by driving the rotator 62 of the at least one pump 6. In addition, the cooling liquid W flows as shown in FIG. 6, FIG. 7, FIG. 8, FIG. 9, FIG. 7, and FIG. 10 in sequence.

Figure 4:
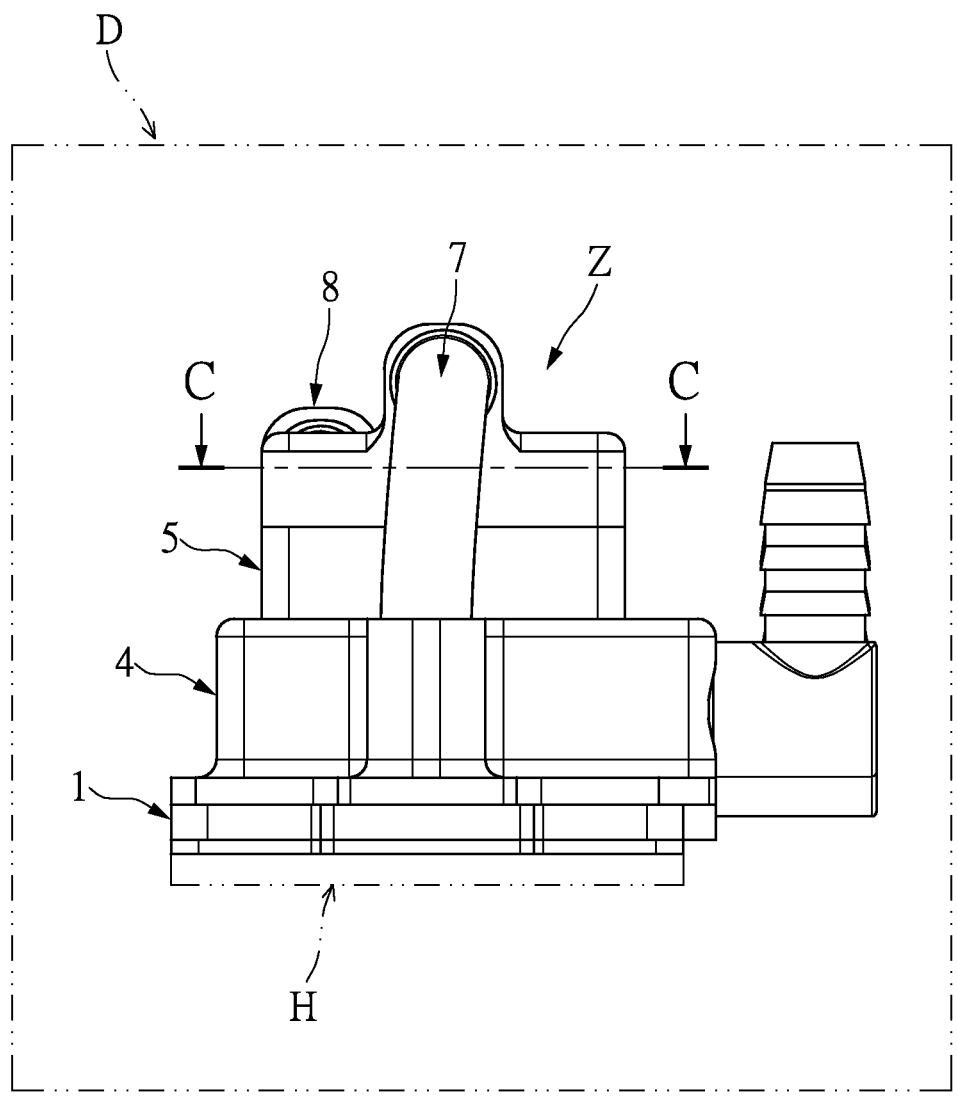
FIG. 4 shows a lateral, schematic view of the electronic device using a liquid cooling heat dissipation device according to one of the embodiments of the instant disclosure.
Figure 5:
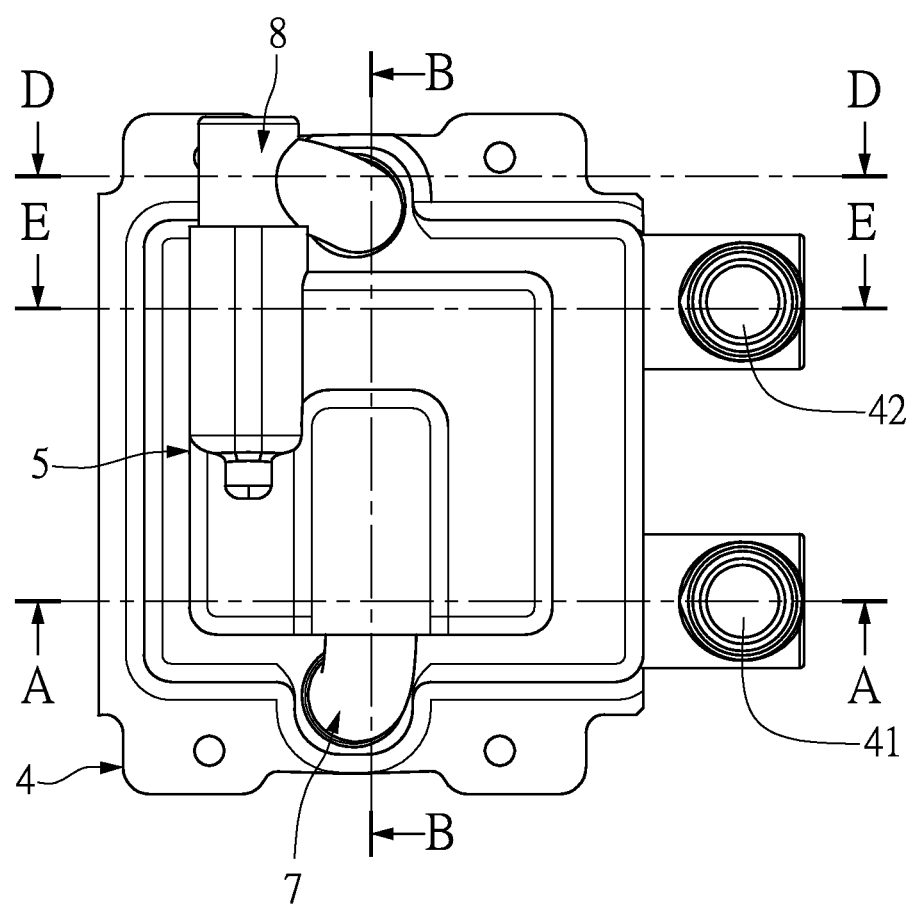
FIG. 5 shows a top, schematic view of the liquid cooling heat dissipation device according to one of the embodiments of the instant disclosure.
Figure 6:
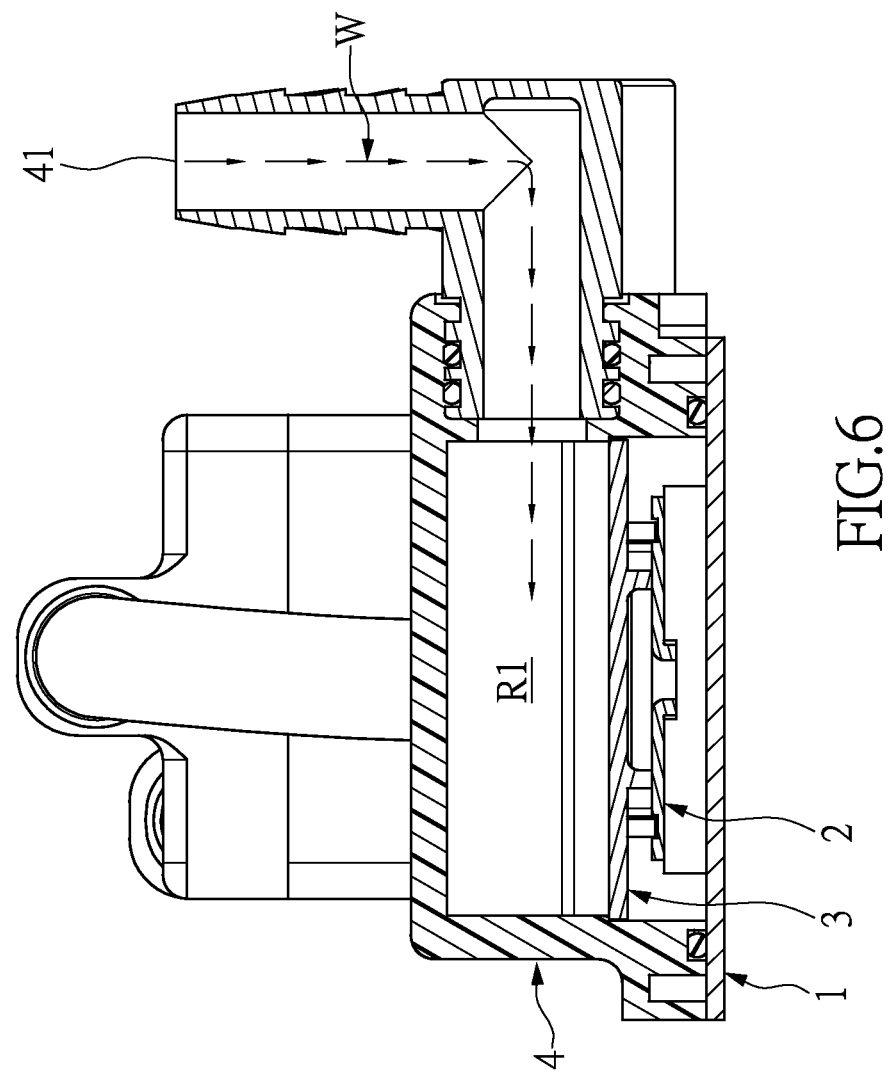
FIG. 6 shows a cross-sectional, schematic view taken along the section line A-A of FIG. 5.

Referring to FIG. 4, the instant disclosure further provides an electronic device D (such as a computer host) including a liquid cooling heat dissipation device Z disposed on at least one heat generation component H thereof for dissipating heat from the at least one heat generation component H. More particularly, the electronic device D can be replaced by any type of heat-dissipating carrier. For example, the heat-dissipating carrier may be a heat-dissipating plate, and the liquid cooling heat dissipation device Z can be disposed on the heat-dissipating plate for increasing heat-dissipating efficiency of the heat-dissipating plate.

Figure 11:
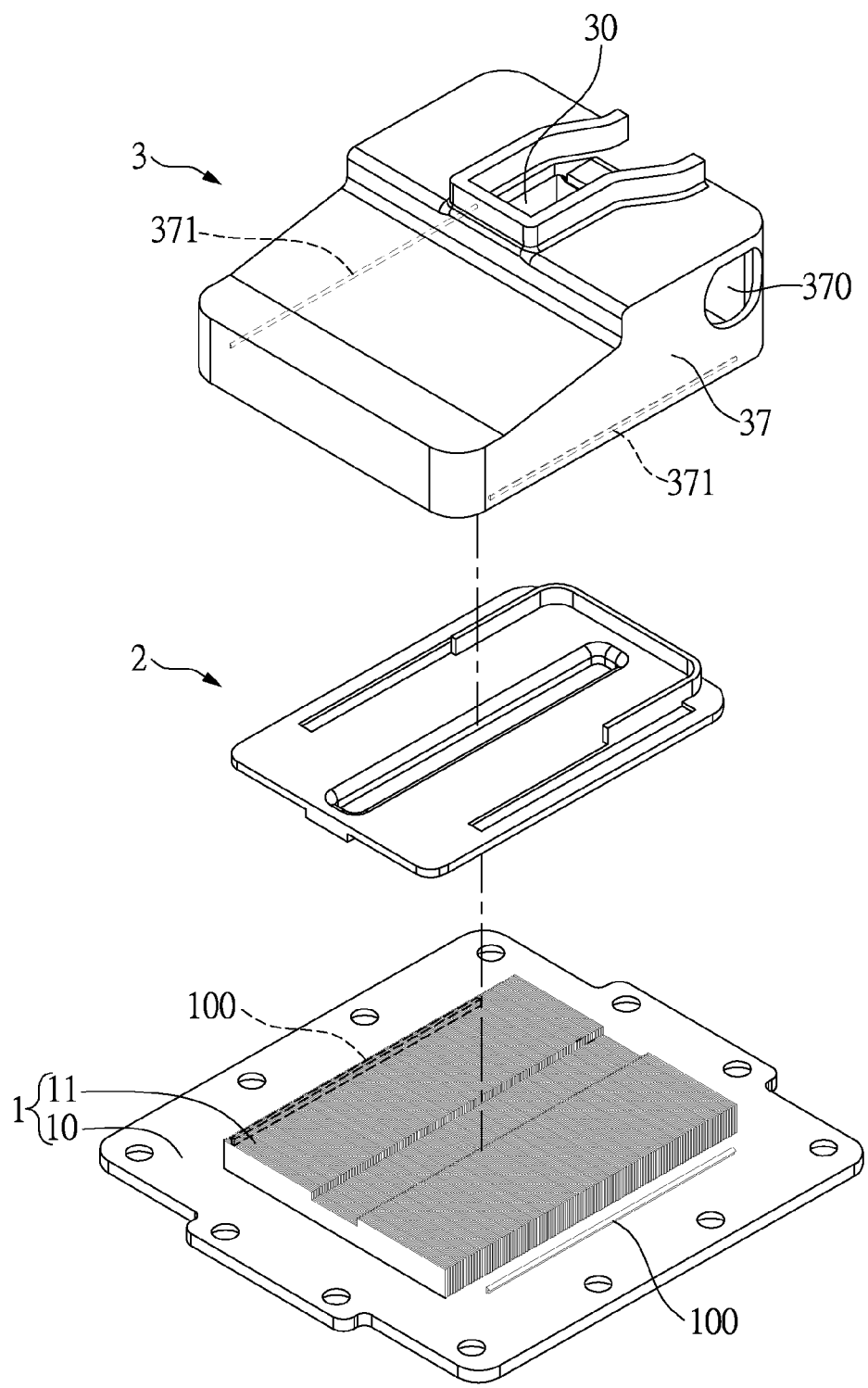
FIG. 11 shows a partial, perspective, exploded, schematic view of the liquid cooling heat dissipation device according to another one of the embodiments of the instant disclosure.
Figure 12:
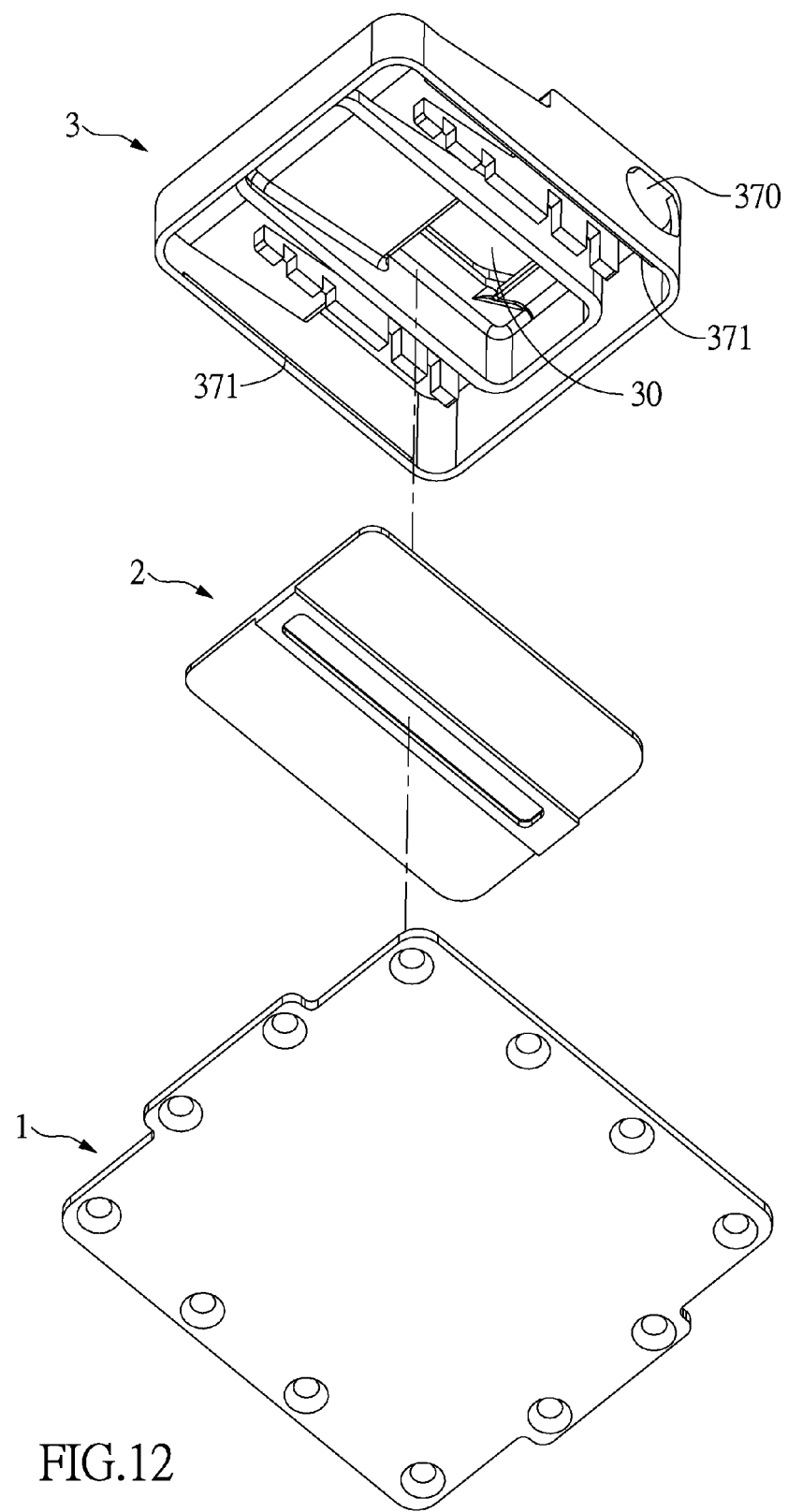
FIG. 12 shows another partial, perspective, exploded, schematic view of the liquid cooling heat dissipation device according to another one of the embodiments of the instant disclosure.

In addition, referring to FIG. 11 and FIG. 12, another one of the embodiments of the instant disclosure provides a liquid cooling heat dissipation device. Comparing FIG. 2 and FIG. 3 with FIG. 11 and FIG. 12 respectively, the different between the two embodiments is as follows: referring to FIG. 11 and FIG. 12, the fluid-conducting board 3 has a surrounding blocking wall 37. The heat-conducting body 10 has at least two first retaining structures 100 disposed on a top surface thereof, and the surrounding blocking wall 37 has at least two second retaining structures 371 disposed on an inner surface thereof to respectively correspond to the at least two first retaining structures 100. Therefore, the fluid-conducting board 3 is detachably positioned on the heat-conducting body 10 by matching the at least two first retaining structures 100 and the at least two second retaining structures 371. Please note, the fluid-conducting board 3 can be directly assembled on the heat-conducting body 10 by a retaining means, so that the fluid-conducting board 3, the fluid-splitting board 2, and the heat-conducting substrate 1 can be sequentially assembled on top of one another in advance to form a module structure. It is worth mentioning that the surrounding blocking wall 37 has a through opening 370 communicated with the at least one liquid outlet 42, so that cooling liquid W flows into the module structure through the fluid-conducting opening 30 and flows out of the module structure through the through opening 370, and then is transmitted to the at least one liquid outlet 42.

Figure 13:
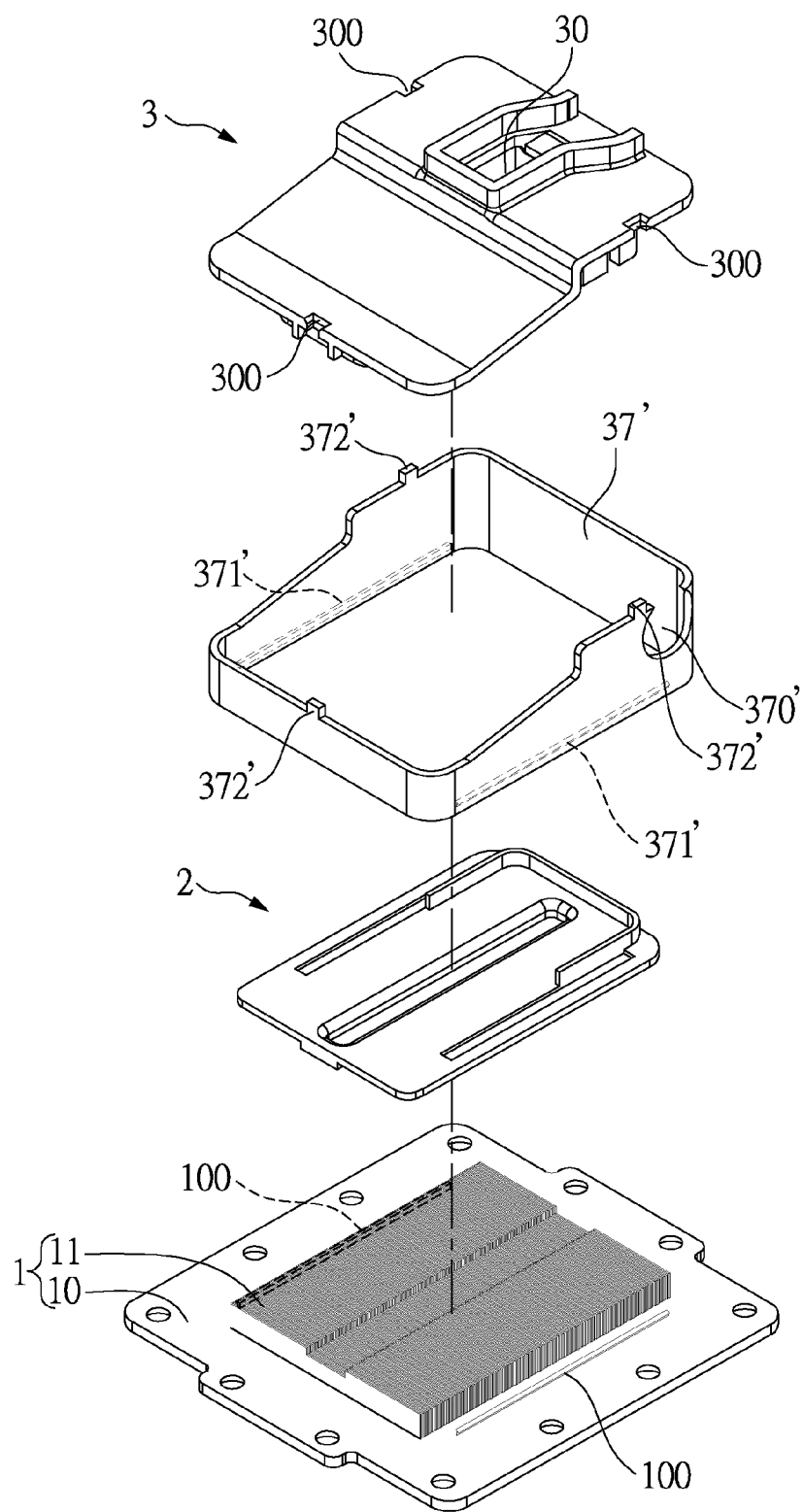
FIG. 13 shows a partial, perspective, exploded, schematic view of the liquid cooling heat dissipation device according to yet another one of the embodiments of the instant disclosure.
Figure 14:
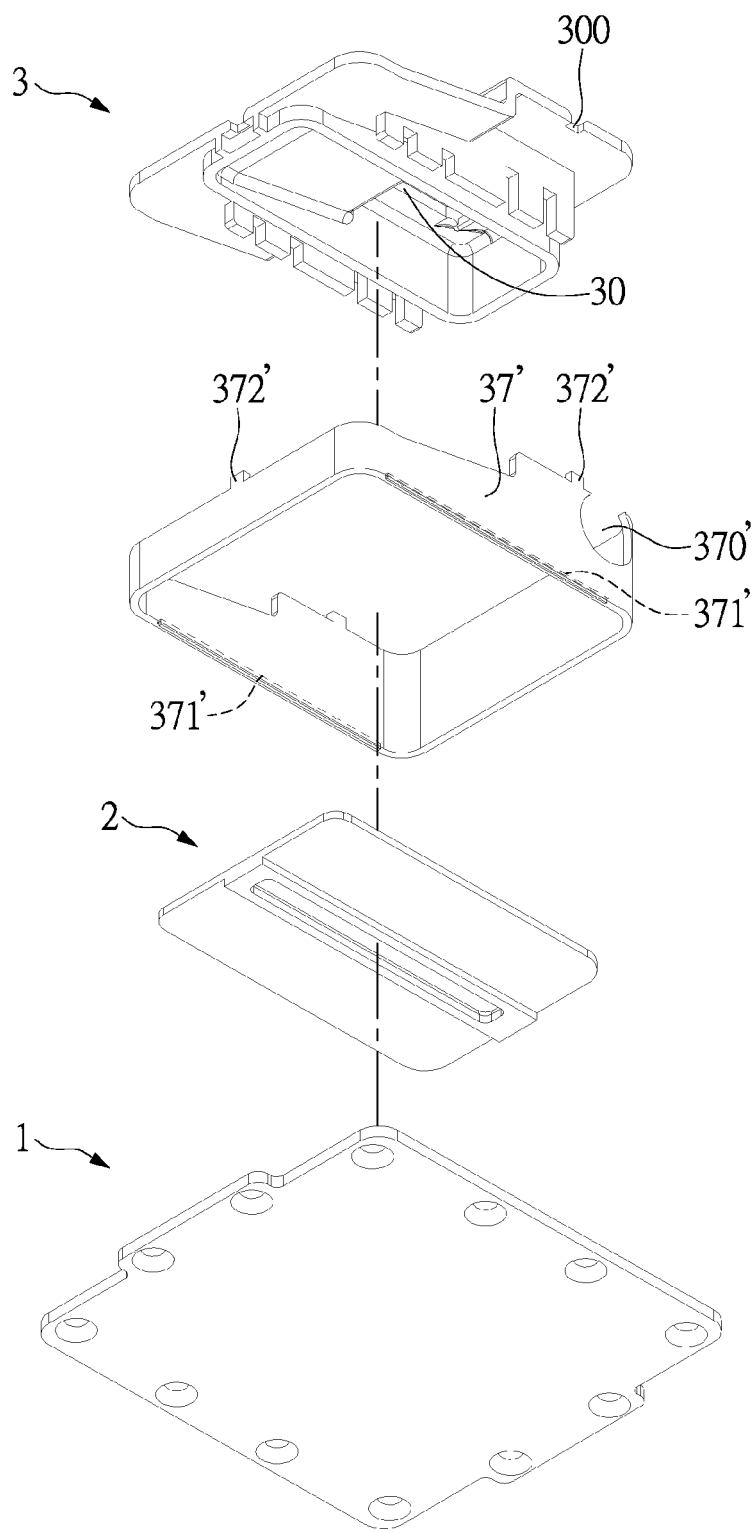
FIG. 14 shows another partial, perspective, exploded, schematic view of the liquid cooling heat dissipation device according to yet another one of the embodiments of the instant disclosure.

Furthermore, referring to FIG. 13 and FIG. 14, yet another one of the embodiments of the instant disclosure provides a liquid cooling heat dissipation device. Comparing FIG. 2 and FIG. 3 with FIG. 13 and FIG. 14 respectively, the different between the two embodiments is as follows: referring to FIG. 13 and FIG. 14, the liquid cooling heat dissipation device further comprising a surrounding blocking wall 37'. The heat-conducting body 10 has at least two first retaining structures 100 disposed on a top surface thereof, and the surrounding blocking wall 37' has at least two second retaining structures 371' disposed on an inner surface thereof to respectively correspond to the at least two first retaining structures 100. Therefore, the surrounding blocking wall 37' is detachably positioned on the heat-conducting body 10 by matching the at least two first retaining structures 100 and the at least two second retaining structures 371'.

More particularly, the fluid-conducting board 3 has a plurality of first positioning structures 300, and the surrounding blocking wall 37' has a plurality of second positioning structures 372' respectively corresponding to the first positioning structures 300. Therefore, the fluid-conducting board 3 is detachably positioned on the surrounding blocking wall 37' by matching the first positioning structures 300 and the second positioning structures 372'. Please note, the fluid-conducting board 3 can be directly assembled on the surrounding blocking wall 37' by a retaining means, and the surrounding blocking wall 37' is detachably positioned on the heat-conducting body 10, so that the fluid-conducting board 3, the surrounding blocking wall 37', the fluid-splitting board 2, and the heat-conducting substrate 1 can be sequentially assembled on top of one another in advance to form a module structure. It is worth mentioning that the surrounding blocking wall 37' has a through opening 370' communicated with the at least one liquid outlet 42, so that cooling liquid W flows into the module structure through the fluid-conducting opening 30 and flows out of the module structure through the through opening 370, and then is transmitted to the at least one liquid outlet 42.

In conclusion, the instant disclosure provides an electronic device D and a liquid cooling heat dissipation device Z thereof, in which the stator 61 is closer to the outer casing body 4 of the heat-dissipating module M1 or nearer to the at least one heat generation component H than the rotator 62 due to the designs of "the outer cover body 5 having an inner space divided into a first independent space 51 adjacent to the outer casing body 4 and a second independent space 52 far away from the outer casing body 4 and insulated from the first independent space 51, and the at least one pump 6 including a stator 61 disposed inside the first independent space 51 and a rotator 62 disposed inside the second independent space 52", "the outer casing body 4 having an inner space divided into a first receiving space R1 and a second receiving space R2 by the fluid-conducting board 3, and the first receiving space R1 and the second receiving space R2 being insulated from each other", and "the liquid supply module M2 including at least one first connection pipe 7 connected between the first receiving space R1 of the outer casing body 4 and the second independent space 52 of the outer cover body 5 and at least one second connection pipe 8 connected between the second independent space 52 of the outer cover body 5 and the second receiving space R2 of the outer casing body 4".

Please note, (1) the cooling liquid W respectively passes though the heat-dissipating fins 11 and the first receiving space R1 to respectively form hot water and cool water, and the hot water and the cool water are not mixed with each other, so that the heat-dissipating efficiency of the instant disclosure can be increased; (2) when the cooling liquid W passes through the pump 6, the cooling liquid W is cold, so that working life of the pump 6 can be increased.

The aforementioned descriptions merely represent the preferred embodiments of the instant disclosure, without any intention to limit the scope of the instant disclosure which is fully described only within the following claims. Various equivalent changes, alterations or modifications based on the claims of the instant disclosure are all, consequently, viewed as being embraced by the scope of the instant disclosure.

What is claimed is:

1. A liquid cooling heat dissipation device, comprising:
   a heat-dissipating module; and
   a liquid supply module including an outer cover body disposed on the heat-dissipating module and at least one pump disposed inside the outer cover body, wherein the outer cover body has an inner space divided into a first independent space adjacent to the heat-dissipating module and a second independent space far away from the heat-dissipating module and insulated from the first independent space, the at least one pump includes a stator disposed inside the first independent space and a rotator disposed inside the second independent space, and the stator is closer to the heat-dissipating module than the rotator;

wherein the heat-dissipating module includes:
a heat-conducting substrate having a heat-conducting body contacting at least one heat generation component and a plurality of heat-dissipating fins disposed on the heat-conducting body;
a fluid-splitting board disposed on the heat-dissipating fins;
a fluid-conducting board disposed on the fluid-splitting board; and
an outer casing body is disposed on the heat-conducting body to cover the heat-dissipating fins, the fluid-splitting board, and the fluid-conducting board.

2. The liquid cooling heat dissipation device of claim 1, wherein the outer casing body has an inner space divided into a first receiving space and a second receiving space by the fluid-conducting board, the first receiving space and the second receiving space are insulated from each other, the fluid-conducting board has at least one fluid-conducting opening disposed inside the second receiving space, and the fluid-splitting board has at least one fluid-splitting opening communicated between the second receiving space and a third receiving space for receiving the heat-dissipating fins.

3. The liquid cooling heat dissipation device of claim 2, wherein the liquid supply module includes at least one first connection pipe connected between the first receiving space of the outer casing body and the second independent space of the outer cover body and at least one second connection pipe connected between the second independent space of the outer cover body and the second receiving space of the outer casing body.

4. The liquid cooling heat dissipation device of claim 3, wherein a first end portion of the first connection pipe and a first end portion of the second connection pipe are respectively connected to two opposite lateral sides of the outer casing body, a second end portion of the first connection pipe and a second end portion of the second connection pipe both are connected to a top side of the outer cover body.

5. The liquid cooling heat dissipation device of claim 1, wherein the heat-dissipating fins are divided into two first heat-dissipating parts corresponding to each other and a second heat-dissipating part connected between the two first heat-dissipating parts, and the fluid-splitting board has a main portion contacting the two first heat-dissipating parts, a convex portion protruded downwardly from a bottom side of the main portion to contact the second heat-dissipating part, a concave portion concaved downwardly from a top side of the main portion, and a position-limiting portion protruded upwardly from the top side of the main portion.

6. The liquid cooling heat dissipation device of claim 5, wherein position of the fluid-conducting board is limited between an inner surface of the outer casing body and the fluid-splitting board, and the fluid-conducting board has a vertical portion upwardly abutted against the inner surface of the outer casing body, an inclined portion transversely and obliquely extended from a bottom side of the vertical portion along a first predetermined direction to transversely abut against the inner surface of the outer casing body, two extending portions transversely extended from the vertical portion along a second predetermined direction to transversely abut against the inner surface of the outer casing body, two first support portions extended downwardly from the vertical portion, the inclined portion, and the two extending portions to downwardly abut against the main portion of the fluid-splitting board and respectively contact the two position-limiting portions, a connection portion connected between the two first support portions, and two second support portions extended downwardly from the vertical portion, the inclined portion, and the two extending portions to be respectively positioned inside two concave portions of the fluid-splitting board and respectively contact the two position-limiting portions.

7. The liquid cooling heat dissipation device of claim 1, wherein the fluid-conducting board has a surrounding blocking wall, the surrounding blocking wall has a through opening communicated with the at least one liquid outlet, the heat-conducting body has at least two first retaining structures disposed on a top surface thereof, the surrounding blocking wall has at least two second retaining structures disposed on an inner surface thereof to respectively correspond to the at least two first retaining structures, and the fluid-conducting board is detachably positioned on the heat-conducting body by matching the at least two first retaining structures and the at least two second retaining structures.

8. The liquid cooling heat dissipation device of claim 1, further comprising: a surrounding blocking wall, wherein the surrounding blocking wall has a through opening communicated with the at least one liquid outlet, the heat-conducting body has at least two first retaining structures disposed on a top surface thereof, the surrounding blocking wall has at least two second retaining structures disposed on an inner surface thereof to respectively correspond to the at least two first retaining structures, and the surrounding blocking wall is detachably positioned on the heat-conducting body by matching the at least two first retaining structures and the at least two second retaining structures.

9. The liquid cooling heat dissipation device of claim 8, wherein the fluid-conducting board has a plurality of first positioning structures, the surrounding blocking wall has a plurality of second positioning structures respectively corresponding to the first positioning structures, and the fluid-conducting board is detachably positioned on the surrounding blocking wall by matching the first positioning structures and the second positioning structures.

10. An electronic device, comprising:
at least one heat generation component; and
a liquid cooling heat dissipation device contacting the at least one heat generation component, wherein the liquid cooling heat dissipation device includes:
a heat-dissipating module; and
a liquid supply module including an outer cover body disposed on the heat-dissipating module and at least one pump disposed inside the outer cover body, wherein the outer cover body has an inner space divided into a first independent space adjacent to the heat-dissipating module and a second independent space far away from the heat-dissipating module and insulated from the first independent space, the at least one pump includes a stator disposed inside the first independent space and a rotator disposed inside the second independent space, and the stator is closer to the heat-dissipating module than the rotator;

wherein the heat-dissipating module includes:
a heat-conducting substrate having a heat-conducting body contacting the at least one heat generation component and a plurality of heat-dissipating fins disposed on the heat-conducting body;

a fluid-splitting board disposed on the heat-dissipating fins;

a fluid-conducting board disposed on the fluid-splitting board; and an outer casing body is disposed on the heat-conducting body to cover the heat-dissipating fins, the fluid-splitting board, and the fluid-conducting board.

11. The electronic device of claim 10, wherein the outer casing body has an inner space divided into a first receiving space and a second receiving space by the fluid-conducting board, the first receiving space and the second receiving space are insulated from each other, the fluid-conducting board has at least one fluid-conducting opening disposed inside the second receiving space, and the fluid-splitting board has at least one fluid-splitting opening communicated between the second receiving space and a third receiving space for receiving the heat-dissipating fins.

12. The electronic device of claim 11, wherein the liquid supply module includes at least one first connection pipe connected between the first receiving space of the outer casing body and the second independent space of the outer cover body and at least one second connection pipe connected between the second independent space of the outer cover body and the second receiving space of the outer casing body.

13. The electronic device of claim 12, wherein a first end portion of the first connection pipe and a first end portion of the second connection pipe are respectively connected to two opposite lateral sides of the outer casing body, a second end portion of the first connection pipe and a second end portion of the second connection pipe both are connected to a top side of the outer cover body.

14. The electronic device of claim 10, wherein the heat-dissipating fins are divided into two first heat-dissipating parts corresponding to each other and a second heat-dissipating part connected between the two first heat-dissipating parts, and the fluid-splitting board has a main portion contacting the two first heat-dissipating parts, a convex portion protruded downwardly from a bottom side of the main portion to contact the second heat-dissipating part, a concave portion concaved downwardly from a top side of the main portion, and a position-limiting portion protruded upwardly from the top side of the main portion.

15. The electronic device of claim 14, wherein the position of the fluid-conducting board is limited between an inner surface of the outer casing body and the fluid-splitting board, and the fluid-conducting board has a vertical portion upwardly abutted against the inner surface of the outer casing body, an inclined portion transversely and obliquely extended from a bottom side of the vertical portion along a first predetermined direction to transversely abut against the inner surface of the outer casing body, two extending portions transversely extended from the vertical portion along a second predetermined direction to transversely abut against the inner surface of the outer casing body, two first support portions extended downwardly from the vertical portion, the inclined portion, and the two extending portions to downwardly abut against the main portion of the fluid-splitting board and respectively contact the two position-limiting portions, a connection portion connected between the two first support portions, and two second support portions extended downwardly from the vertical portion, the inclined portion, and the two extending portions to be respectively positioned inside two concave portions of the fluid-splitting board and respectively contact the two position-limiting portions.

16. The electronic device of claim 10, wherein the fluid-conducting board has a surrounding blocking wall, the surrounding blocking wall has a through opening communicated with the at least one liquid outlet, the heat-conducting body has at least two first retaining structures disposed on a top surface thereof, the surrounding blocking wall has at least two second retaining structures disposed on an inner surface thereof to respectively correspond to the at least two first retaining structures, and the fluid-conducting board is detachably positioned on the heat-conducting body by matching the at least two first retaining structures and the at least two second retaining structures.

17. The electronic device of claim 10, further comprising: a surrounding blocking wall, wherein the surrounding blocking wall has a through opening communicated with the at least one liquid outlet, the heat-conducting body has at least two first retaining structures disposed on a top surface thereof, the surrounding blocking wall has at least two second retaining structures disposed on an inner surface thereof to respectively correspond to the at least two first retaining structures, and the surrounding blocking wall is detachably positioned on the heat-conducting body by matching the at least two first retaining structures and the at least two second retaining structures.

18. The electronic device of claim 17, wherein the fluid-conducting board has a plurality of first positioning structures, the surrounding blocking wall has a plurality of second positioning structures respectively corresponding to the first positioning structures, and the fluid-conducting board is detachably positioned on the surrounding blocking wall by matching the first positioning structures and the second positioning structures.

* * * * *